United States Patent
He

(10) Patent No.: US 9,129,821 B1
(45) Date of Patent: Sep. 8, 2015

(54) ELECTROSTATIC DISCHARGE PROTECTION DEVICE

(71) Applicant: MACRONIX International Co., Ltd., Hsinchu (TW)

(72) Inventor: Chieh-Wei He, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/272,162

(22) Filed: May 7, 2014

(51) Int. Cl.
*H01L 23/62* (2006.01)
*H01L 27/06* (2006.01)
*H01L 27/02* (2006.01)
*H01L 49/02* (2006.01)
*H01L 29/866* (2006.01)
*H01L 29/861* (2006.01)
*H01L 29/78* (2006.01)

(52) U.S. Cl.
CPC ........ *H01L 27/0629* (2013.01); *H01L 27/0255* (2013.01); *H01L 27/0266* (2013.01); *H01L 27/0288* (2013.01); *H01L 28/20* (2013.01); *H01L 28/40* (2013.01); *H01L 29/78* (2013.01); *H01L 29/861* (2013.01); *H01L 29/866* (2013.01)

(58) Field of Classification Search
CPC ............ H01L 27/0248; H01L 27/0251; H01L 27/0266; H01L 27/0629; H01L 27/0255; H02H 9/046
USPC ........................................... 257/360; 361/111
See application file for complete search history.

(56) References Cited

U.S. PATENT DOCUMENTS

| | | |
|---|---|---|
| 2013/0099297 A1 | 4/2013 | He et al. |
| 2014/0285932 A1* | 9/2014 | Miyamoto et al. ............... 361/56 |

OTHER PUBLICATIONS

"Office Action of Taiwan Counterpart Application", issued on May 18, 2015, p1-p4.

* cited by examiner

*Primary Examiner* — Tu-Tu Ho
(74) *Attorney, Agent, or Firm* — J.C. Patents

(57) ABSTRACT

An electrostatic discharge protection device including a protection circuit, a first resister and a low-pass filter is provided. The protection circuit includes a first element and a second element. The first element and the second element are electrically connected in series between a power line and a ground line, and a connection node is disposed between the first element and the second element. The low-pass filter, the protection circuit and the first resister are electrically connected in series between an input pad and an internal circuit.

10 Claims, 3 Drawing Sheets

ELECTROSTATIC DISCHARGE PROTECTION DEVICE

BACKGROUND OF THE INVENTION

1. Field of the Invention

The invention relates to an electrostatic discharge protection device, and particularly relates to an electrostatic discharge protection device having a low-pass filter.

2. Description of Related Art

Electrostatic discharge is a primary factor that influences the reliability of an integrated circuit. Thus, the integrated circuit is commonly designed with an electrostatic discharge protection device. In addition, as the technology of manufacture of semiconductors is now advanced to the deep sub-micron dimension, an electronic product with the integrated circuit is usually required to pass a component-level ESD test and a system-level ESD test before mass production. When packaging of the integrated circuit is completed, the component-level ESD test is performed. Then, when the integrated circuit is installed in the electronic device, the system-level ESD test is further performed.

Under the system-level ESD test, energy released through electrostatic discharge is even stronger. Therefore, most of conventional electrostatic discharge protection devices are not able to help the integrated circuit pass the system-level ESD test. The reliability of the integrated circuits is thus reduced.

SUMMARY OF THE INVENTION

Accordingly, an embodiment of the invention provides an electrostatic discharge protection device using a low-pass filter to guide electrostatic discharge signals, such that an integrated circuit may pass a system-level ESD test.

According to an embodiment of the invention, the electrostatic discharge protection device of the invention includes a protection circuit, a first resistor, and a low-pass filter. The protection circuit includes a first element and a second element. The first element and the second element are electrically connected in series between a power line and a ground line, and a connection node is disposed between the first element and the second element. The low-pass filter, the protection circuit, and the first resistor are electrically connected in series between an input pad and an internal circuit.

In view of the above, the electrostatic discharge protection device of the invention is configured with the low-pass filter, and an electrostatic signal may be guided to the ground line through the low-pass filter. Accordingly, the electrostatic discharge protection device may allow the integrated circuit to pass the system-level ESD test. The reliability of the integrated circuit is thus improved.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
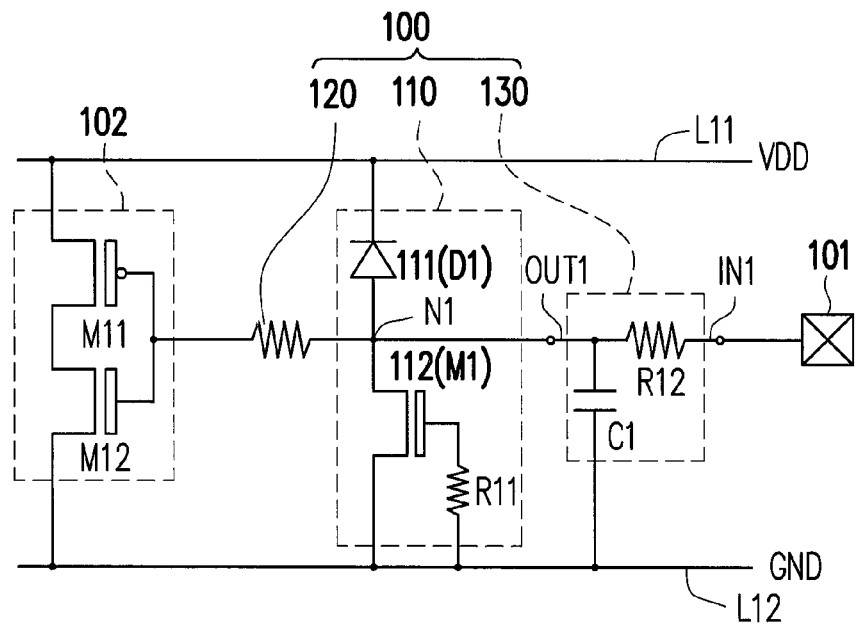
FIG. 1 is a schematic circuit view illustrating an electrostatic discharge protection device according to an embodiment of the invention.

FIG. 1 is a schematic circuit view illustrating an electrostatic discharge protection device according to an embodiment of the invention. Referring to FIG. 1, an electrostatic discharge device 100 is adapted for an integrated circuit. The integrated circuit includes an input pad 101 and an internal circuit 102. In addition, the internal circuit 102 may receive an input signal through the input pad 101, and the internal circuit 101 includes an input buffer formed by a PMOS transistor M11 and an NMOS transistor M12. The electrostatic discharge protection device 100 is configured to prevent an electrostatic signal of the input pad 101 from damaging the internal circuit 102.

The electrostatic discharge protection device 100 includes a protection circuit 110, a resistor 120, and a low-pass filter 130. The low-pass filter 130, the protection circuit 110, and the resistor 120 are electrically connected in series between the input pad 101 and the internal circuit 102. Moreover, the protection circuit 110 includes a first element 111 and a second element 112. The first element 111 and the second element 112 are electrically connected in series between a power line L11 and a ground line L12, and a connection node N1 is disposed between the first element 111 and the second element 112.

In an embodiment, the first element 111 may be a diode D1 and the second element 112 may be an NMOS transistor M1 as shown in FIG. 1. In addition, a cathode of the diode D1 is electrically connected to the power line L11, and an anode of the diode D1 is electrically connected to the connection node N1. A drain of the NMOS transistor M1 is electrically connected to the connection node N1, and a gate of the NMOS transistor M1 is electrically connected to the ground line L12 through a resistor R11. In addition, a source of the NMOS transistor M1 is electrically connected to the ground line L12.

The low-pass filter 130 has an input end IN1 and an output end OUT1. Moreover, the input end IN1 of the low-pass filter 130 is electrically connected to the input pad 101, and the output end OUT1 of the low-pass filter 130 is electrically connected to the drain of the NMOS transistor M1 and a first end of the resistor 120. Furthermore, a second end of the resistor 120 is electrically connected to the internal circuit 102. In an embodiment, the low-pass filter 130 includes a resistor R12 and a capacitor C1, as shown in FIG. 1. In addition, the resistor R12 is electrically connected between the input end IN1 and the output end OUT1 of the low-pass filter 130. A first end of the capacitor C1 is electrically connected to the output end OUT1 of the low-pass filter 130, and a second end of the capacitor C1 is electrically connected to the ground line L12.

When the internal circuit 102 normally operates, the power line L11 and the ground line L12 are respectively configured to transmit a power voltage VDD and a ground voltage GND, and the internal circuit 102 may receive the input signal through the input pad 101. On the other hand, when an ESD event occurs, namely the electrostatic signal appears on the input pad 101, the electrostatic signal is equivalent to a high-frequency signal. Thus, the low-pass filter 130 may be configured to filter the electrostatic signal. Moreover, the first element 111 in the protection circuit 110 may provide a discharging path connected to the power line L11, and the second element 112 may provide a discharging path connected to the ground line L12. Thus, when the electrostatic event occurs, a large amount of the electrostatic signal may be guided to the ground line L12 through the low-pass filter 130, and remaining of the electrostatic signal may be guided to the power line L11 or the ground line L12 through the protection circuit 110. In addition, the resistor 120 may be configured to block the electrostatic signal from flowing into the internal circuit 102.

In this way, the electrostatic discharge protection device 100 may prevent the electrostatic signal of the input pad 101 from damaging the internal circuit 102. It should be noted that when the electrostatic event occurs, the low-pass filter 130 may guide a large amount of the electrostatic signal to the ground line L12. Thus, the electrostatic discharge protection device 100 may sustain the electrostatic signal that meet a system-level ESD testing standard. In other words, in an actual application, the electrostatic discharge protection device 100 may allow an integrated circuit to pass a system-level ESD test, thereby improving a reliability of the integrated circuit.

Figure 2:
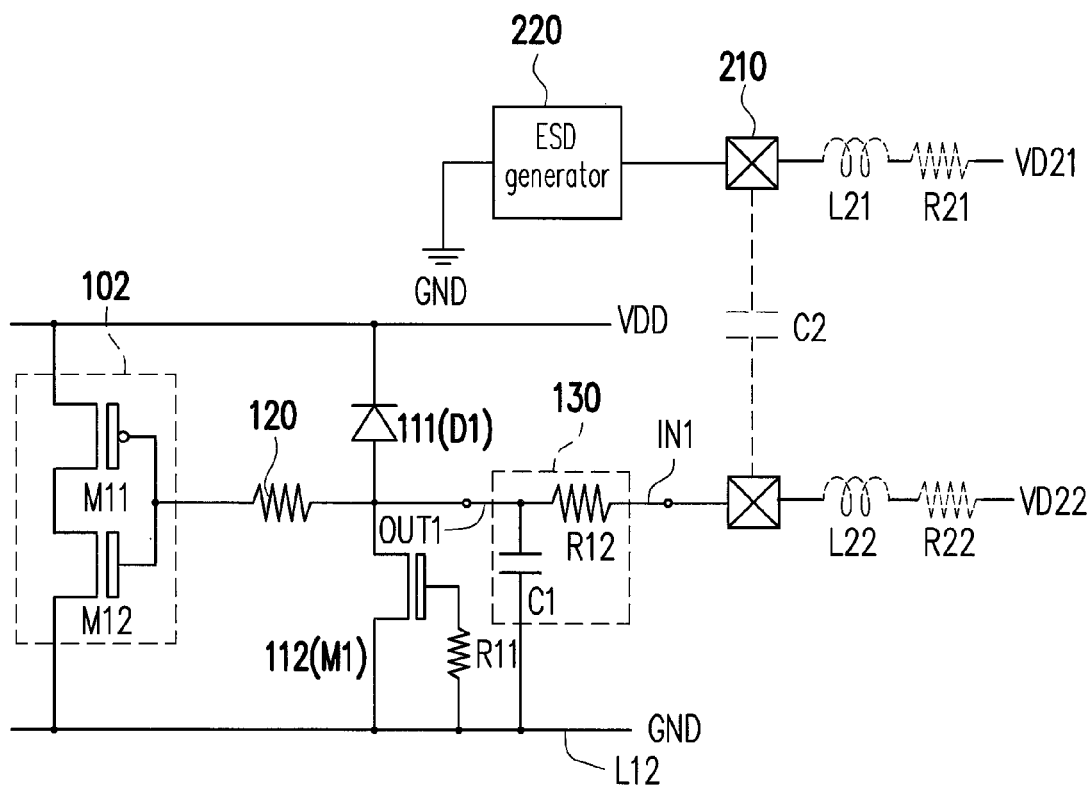
FIG. 2 is a schematic simulation view illustrating that an electrostatic discharge protection device under a system-level ESD test according to an embodiment of the invention.

For example, FIG. 2 is a schematic simulation view illustrating that an electrostatic discharge protection device under a system-level ESD test according to an embodiment of the invention. In FIG. 2, the integrated circuit that the electrostatic discharge protection device 100 is suitable for further includes a pad 210. In addition, the input pad 101 and the pad 210 are respectively configured to receive input voltages VD21 and VD22, and inductors L21 and L22 and resistors R21 and R22 are configured to represent equivalent circuits of the input voltages VD21 and VD22. In addition, an ESD generator 220 is configured to generate the electrostatic signal that meet the system-level ESD testing standard. For example, the ESD generator 220 may generate an electrostatic signal that meets a standard of IEC61000-4-2, for example.

It should be noted that the system-level ESD test is performed after the integrated circuit is installed in an electronic device. Besides, during an actual testing process, an ESD gun may be used to perform a discharge test at a slit or an opening of the electronic device, and a reliability of the electronic device is evaluated based on a degree that the electronic device is influenced. Correspondingly, in a circuit simulation, the embodiment shown in FIG. 2 uses the ESD generator 220 and a coupling effect between the two pads 101 and 210 to simulate an actual testing environment.

Specifically, a parasitic capacitance C2 may be generated between the input pad 101 and the pad 210. When the electrostatic generator 220 generates the electrostatic signal, the pad 210 receives the electrostatic signal, and the electrostatic signal from the pad 210 may be coupled to the input pad 101 through the parasitic capacitance C2. In addition, when the electrostatic signal appears at the input pad 101, the capacitor C1 in the low-pass filter 130 is equivalent to a short circuit. Thus, a large amount of the electrostatic signal may be guided to the ground line L12 through the low-pass filter 130, and remaining of the electrostatic signal may be guided to the power line L11 or the ground line L12. Accordingly, the electrostatic discharge protection device 100 may allow the integrated circuit to pass the system-level ESD test. The reliability of the integrated circuit is thus improved.

It should be noted that although the embodiment shown in FIG. 1 illustrates a connection configuration of the protection circuit 110, the resistor 120, and the low-pass filter 130, the invention is not limited thereto. People having ordinary skill in the art may, based on their design needs, adopt an arbitrary arrangement to connect the protection circuit 110, the resistor 120, and the low-pass filter 130 in series between the input pad 101 and the internal circuit 102.

Figure 3:
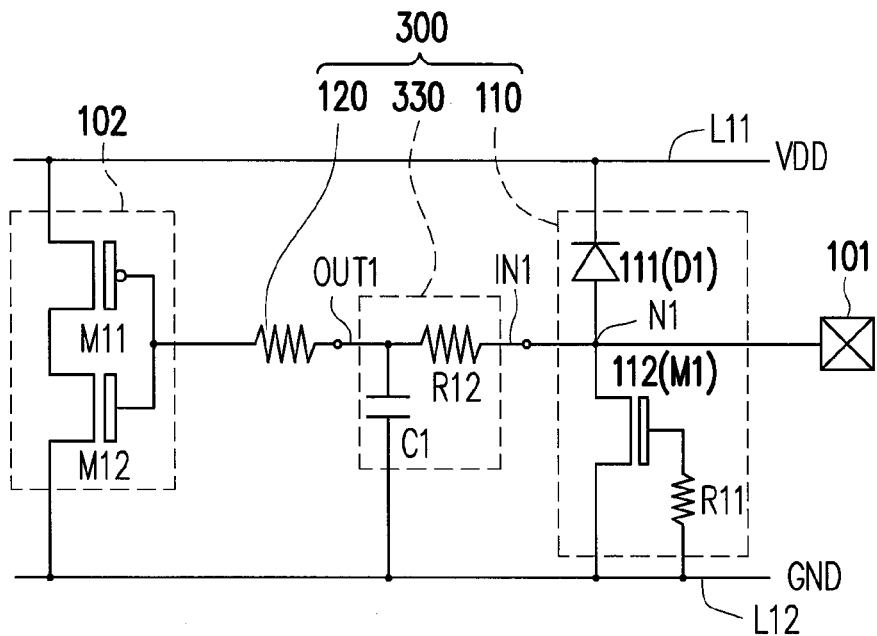
FIG. 3 is a schematic circuit view illustrating an electrostatic discharge protection device according to another embodiment of the invention.

For example, FIG. 3 is a schematic circuit view illustrating an electrostatic discharge protection device according to another embodiment of the invention. An electrostatic discharge protection device 300 shown in FIG. 3 is similar to the electrostatic discharge protection device 100 shown in FIG. 1. A difference between the two lies in that, a low-pass filter 330 in FIG. 3 is electrically connected between the protection circuit 110 and the resistor 120.

Specifically, an input end IN1 of the low-pass filter 330 is electrically connected to the drain of the NMOS resistor M1 and the input pad 101, and an output end OUT1 of the low-pass filter 330 is electrically connected to the first end of the resistor 120. Moreover, a second end of the resistor 120 is electrically connected to the internal circuit 102. Similar to the embodiment shown in FIG. 1, when the electrostatic signal appears at the the input pad 101, the low-pass filter 330 may guide a large amount of the electrostatic signal to the ground line L12, and remaining of the electrostatic signal may be guided to the power line L11 or the ground line L12 through the protection circuit 110. Accordingly, the electrostatic discharge protection device 300 may allow an integrated circuit to pass the system-level ESD test. The reliability of the integrated circuit is thus improved.

Figure 4:
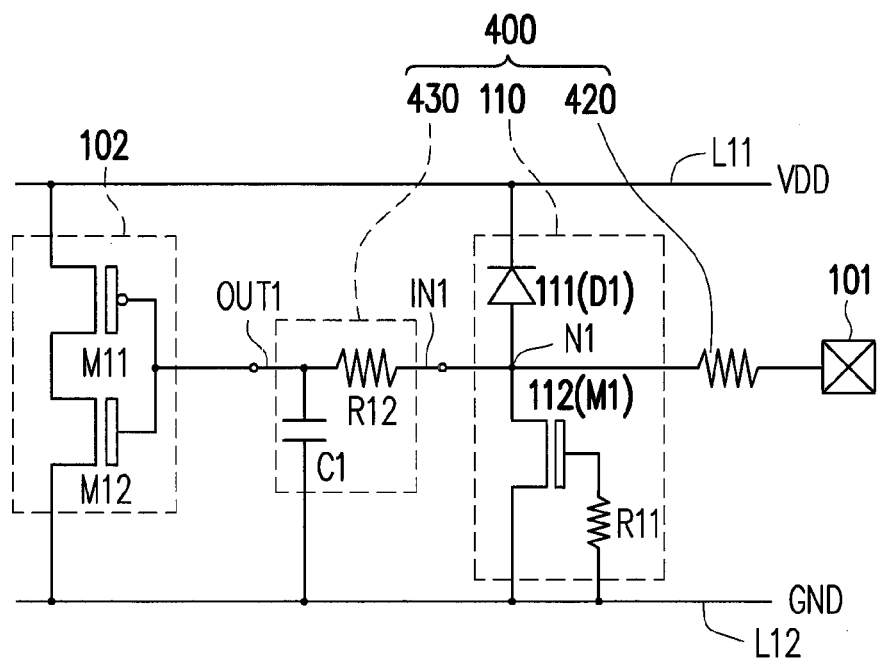
FIG. 4 is a schematic circuit view illustrating an electrostatic discharge protection device according to still another embodiment of the invention.

FIG. 4 is a schematic circuit view illustrating an electrostatic discharge protection device according to still another embodiment of the invention. An electrostatic discharge protection device 400 shown in FIG. 4 is similar to the electrostatic discharge protection device 100 shown in FIG. 1. A difference between the two lies in that, a resistor 420 in FIG. 4 is electrically connected between the input pad 101 and the protection circuit 110, and a low-pass filter 430 in FIG. 4 is electrically connected between the protection circuit 110 and the internal circuit 102.

Specifically, a first end of the resistor 420 is electrically connected to the pad 101. An input end IN1 of the low-pass filter 430 is electrically connected to a second end of the resistor 420 and the drain of the NMOS transistor M1, and an output end OUT1 of the low-pass filter 430 is electrically connected to the internal circuit 102. Similar to the embodiment shown in FIG. 1, when the electrostatic signal appears at the the input pad 101, the low-pass filter 430 may guide a large amount of the electrostatic signal to the ground line L12, and remaining of the electrostatic signal may be guided to the power line L11 or the ground line L12 through the protection circuit 110. Accordingly, the electrostatic discharge protection device 400 may allow an integrated circuit to pass the system-level ESD test. The reliability of the integrated circuit is thus improved.

Besides, although the embodiment shown in FIG. 1 illustrates an implementation of the low-pass filter 130, the invention is not limited thereto. For example, in an embodiment, the low-pass filter 130 may include a capacitor. A first end of the capacitor may be electrically connected to the input end IN1 and the output end OUT1 of the low-pass filter 130, and a second end of the capacitor is electrically connected to the ground line L12. In other words, in view of the embodiments shown in FIGS. 1, 3, and 4, people having ordinary skill in the art may, based on their design needs, remove the resistor R12 of the low-pass filters 130, 330, and 430, and only use the capacitor C1 to realize the low-pass filters 130, 330, and 430.

Figure 5:
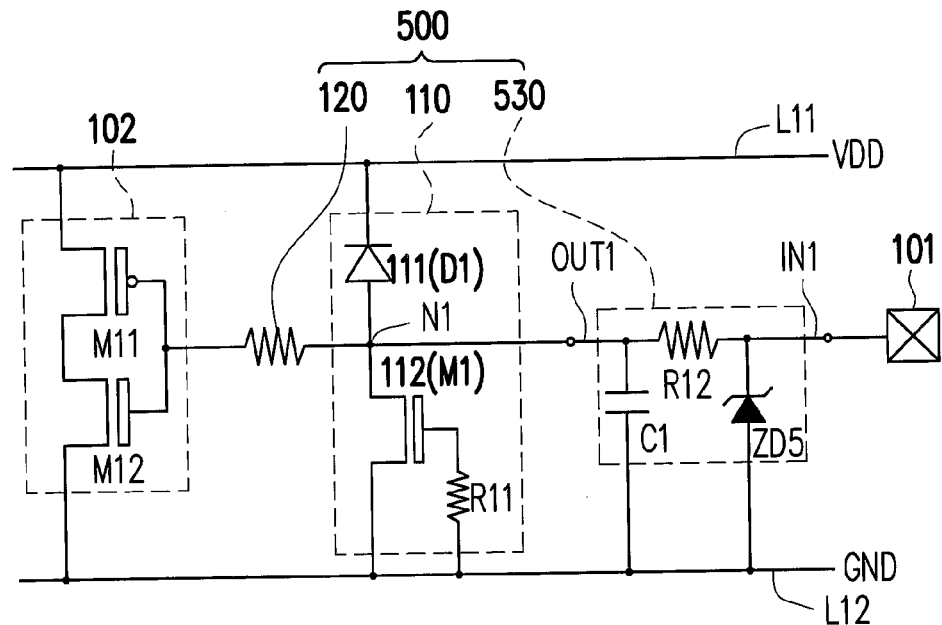
FIG. 5 is a schematic circuit view illustrating an electrostatic discharge protection device according to yet another embodiment of the invention.

In addition, FIG. 5 is a schematic circuit view illustrating an electrostatic discharge protection device according to yet another embodiment of the invention. An electrostatic discharge protection device 500 shown in FIG. 5 is similar to the electrostatic discharge protection device 100 shown in FIG. 1. A difference between the two lies in that, a low-pass filter 530 of FIG. 5 further includes a Zener diode ZD5.

Specifically, a cathode of the Zener diode ZD5 is connected to a first end of the resistor R12, and an anode of the Zener diode ZD5 is electrically connected to the ground line L12. Accordingly, when the electrostatic signal appears at the input pad 101, the low-pass filter 530 may use the Zener diode ZD5 to guide the electrostatic signal to the ground line L12 in addition to using the capacitor C1 to guide the electrostatic signal to the ground line L12. In other words, the low-pass filter 530 may use the Zener diode ZD5 to add a discharging path that guides the electrostatic signal, so as to filter more electrostatic signal. Besides, the Zener diode ZD5 has a lower breakdown voltage, so that a response speed of the electrostatic discharge protection device 500 may thus be facilitated.

It should be noted that in another embodiment, the cathode and the anode of the Zener diode ZD5 may be respectively electrically connected to a second end of the resistor R12 and the ground line L12, and the Zener diode ZD5 here may also guide the electrostatic signal. In addition, in view of the embodiment shown in FIG. 5, people having ordinary skill in the art may, based on their design needs, to respectively dispose the Zener diode ZD5 in the low-pass filters 330 and 430, so as to facilitate the response speed of the electrostatic discharge protection devices 300 and 400.

Figure 6:
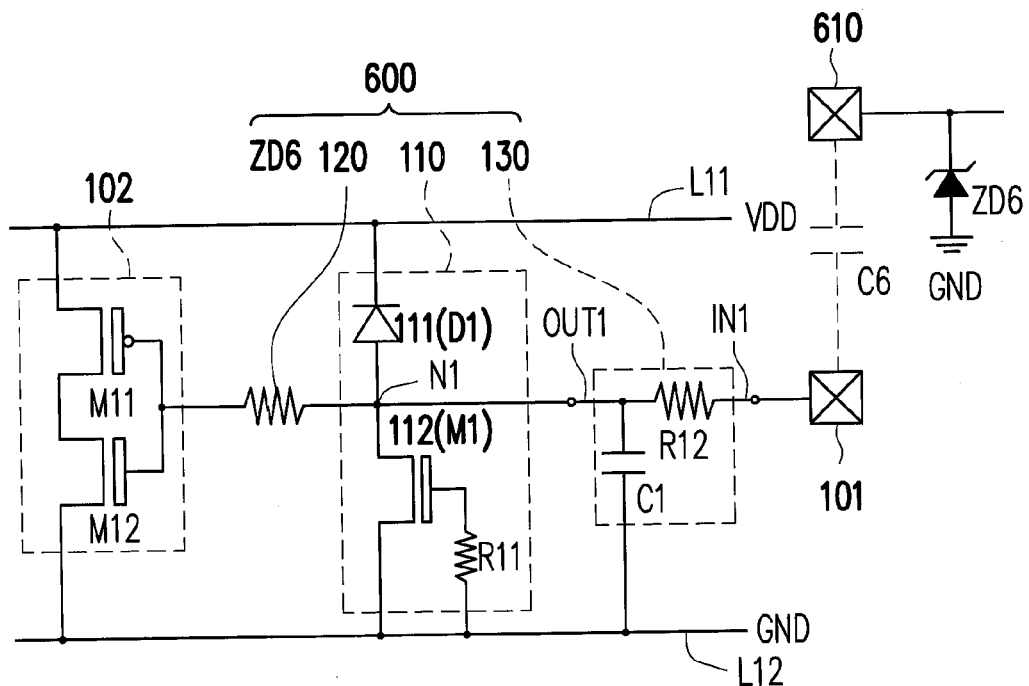
FIG. 6 is a schematic circuit view illustrating an electrostatic discharge protection device according to another embodiment of the invention.

FIG. 6 is a schematic circuit view illustrating an electrostatic discharge protection device according to another embodiment of the invention. An electrostatic discharge protection device 600 shown in FIG. 6 is similar to the electrostatic discharge protection device 100 shown in FIG. 1. A difference between the two lies in that, the electrostatic discharge protection device 600 in FIG. 6 further includes a Zener diode ZD6.

Specifically, the integrated circuit that the electrostatic discharge protection device 600 is suitable for further includes a pad 610. In addition, a cathode of the Zener diode ZD6 is electrically connected to the pad 610, and an anode of the Zener diode ZD6 is electrically connected to the ground line L12. Thus, when the electrostatic signal appears at the pad 610, the Zener diode ZD6 may guide the electrostatic signal to the ground line L12. Thus, the electrostatic signal that are coupled to the input pad 101 through a parasitic capacitance C6 may be significantly reduced, and a protection capability of the electrostatic discharge protection device 600 is further improved. In other words, in view of the embodiment shown in FIG. 6, people having ordinary skill in the art may, based on their design needs, dispose the corresponding Zener diode on the pad in the integrated circuit, so as to further improve the protection capability of the electrostatic discharge protection device.

In view of the foregoing, the electrostatic discharge protection device of the invention is configured with the low-pass filter. Thus, the electrostatic discharge protection device may guide a large amount of the electrostatic signal to the ground line through the low-pass filter. Thus, the electrostatic discharge protection device may undertake the electrostatic signal that meet the ESD testing standard at the system level. In other words, when in actual practice, the electrostatic discharge protection device may allow the integrated circuit to pass the ESD test at the system level. A reliability of the integrated circuit is thus improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection device, comprising:
   a protection circuit, comprising a first element and a second element, wherein the first element and the second element are electrically connected in series between a power line and a ground line, a connection node is disposed between the first element and the second element, the first element is a diode, the diode is electrically connected between the power line and the connection node, the second element is a NMOS transistor, a drain of the NMOS transistor is electrically connected to the connection node, a gate of the NMOS transistor is electrically connected to the ground line through a second resistor, and a source of the NMOS transistor is electrically connected to the ground line;
   a first resistor; and
   a low-pass filter, wherein the low-pass filter, the protection circuit, and the first resistor are electrically connected in series between an input pad and an internal circuit.

2. The electrostatic discharge protection device as claimed in claim 1, wherein an input end of the low-pass filter is electrically connected to the input pad, an output end of the low-pass filter is electrically connected to the drain of the NMOS transistor and a first end of the first resistor, and a second end of the first resistor is electrically connected to the internal circuit.

3. The electrostatic discharge protection device as claimed in claim 1, wherein an input end of the low-pass filter is electrically connected to the drain of the NMOS transistor and the input pad, an output end of the low-pass filter is electrically connected to a first end of the first resistor, and a second end of the first resistor is electrically connected to the internal circuit.

4. The electrostatic discharge protection device as claimed in claim 1, wherein a first end of the first resistor is electrically connected to the input pad, an input end of the low-pass filter is electrically connected to a second end of the first resistor and the drain of the NMOS transistor, and an output end of the low-pass filter is electrically connected to the internal circuit.

5. The electrostatic discharge protection device as claimed in claim 1, wherein the low-pass filter has an input end and an output end, and the low-pass filter comprises:
   a second resistor, electrically connected between the input end and the output end of the low-pass filter; and
   a capacitor, wherein a first end of the capacitor is electrically connected to the output end of the low-pass filter, and a second end of the capacitor is electrically connected to the ground line.

6. The electrostatic discharge protection device as claimed in claim 5, wherein the low-pass filter further comprises:
   a Zener diode, wherein a cathode of the Zener diode is electrically connected to a first end or a second end of the second resistor, and an anode of the Zener diode is electrically connected to the ground line.

7. The electrostatic discharge protection device as claimed in claim 1, wherein the low-pass filter has an input end and an output end, and the low-pass filter comprises:
   a capacitor, wherein a first end of the capacitor is electrically connected to the input end and the output end of the low-pass filter, and a second end of the capacitor is electrically connected to the ground line.

8. The electrostatic discharge protection device as claimed in claim 1, wherein the electrostatic discharge protection device is adapted for an integrated circuit comprising the input pad, the internal circuit and a pad, and the electrostatic discharge protection device further comprises a Zener diode, which has a cathode electrically connected to the pad and an anode electrically connected to the ground line.

9. An electrostatic discharge protection device, comprising:
   a protection circuit, comprising a first element and a second element, wherein the first element and the second element are electrically connected in series between a power line and a ground line, and a connection node is disposed between the first element and the second element;
   a first resistor; and
   a low-pass filter, wherein the low-pass filter, the protection circuit, and the first resistor are electrically connected in series between an input pad and an internal circuit, the low-pass filter has an input end and an output end, and the low-pass filter comprises:
   a second resistor, electrically connected between the input end and the output end of the low-pass filter; and
   a capacitor, wherein a first end of the capacitor is electrically connected to the output end of the low-pass filter, and a second end of the capacitor is electrically connected to the ground line.

10. An electrostatic discharge protection device, comprising:
   a protection circuit, comprising a first element and a second element, wherein the first element and the second element are electrically connected in series between a power line and a ground line, and a connection node is disposed between the first element and the second element;
   a first resistor; and
   a low-pass filter, wherein the low-pass filter, the protection circuit, and the first resistor are electrically connected in series between an input pad and an internal circuit, the low-pass filter has an input end and an output end, the low-pass filter comprises a capacitor, a first end of the capacitor is electrically connected to the input end and the output end of the low-pass filter, and a second end of the capacitor is electrically connected to the ground line.

* * * * *